United States Patent [19]

Mark

[11] Patent Number: 4,727,336

[45] Date of Patent: Feb. 23, 1988

[54] WIDE BAND LOW POWER LOSS VIDEO AMPLIFIER

[75] Inventor: William J. Mark, Glenview, Ill.

[73] Assignee: Zenith Electronics Corporation, Glenview, Ill.

[21] Appl. No.: 881,292

[22] Filed: Jul. 2, 1986

[51] Int. Cl.[4] ............................ H03F 3/26; H04N 5/14
[52] U.S. Cl. ..................................... 330/267; 330/263; 358/184
[58] Field of Search ............... 330/263, 267, 276, 270; 358/39, 184, 188, 160

[56] References Cited

U.S. PATENT DOCUMENTS 4,293,875 10/1981 Katz ...................................... 330/263

*Primary Examiner*—Gene Wan

[57] ABSTRACT

Two cascode amplifiers are connected in parallel and include RC bypass circuits across their emitter and collector load resistors. The amplifiers are biased so that positive going transitions of an input video signal drive one amplifier into conduction and negative going excursions drive the other amplifier into conduction. The RC bypass circuits make the amplifier wide band and low power dissipation is obtained because the collector load resistors can be made large.

5 Claims, 2 Drawing Figures

WIDE BAND LOW POWER LOSS VIDEO AMPLIFIER

BACKGROUND OF THE INVENTION AND PRIOR ART

This invention relates generally to high frequency video amplifiers and specifically to video amplifiers utilized in video monitors requiring a wide bandwidth and high drive voltages.

High resolution video monitors have frequency bandwidths greater than of 100 MHz as contrasted with normal television video amplifier bandwidths of 6 MHz. the large bandwidth is required to enable the higher horizontal scanning frequencies necessary to create the high resolution display. In many applications, the video amplifier must also provide very large drive voltages for the cathode ray tube (CRT). For example, a color monitor needs approximately 50 volts of drive voltage whereas only about 35 volts is needed in a monochrome monitor. In some automotive applications, the high ambient light conditions may dictate a video drive voltage of 80 volts or more. Large drive voltages make the task of designing a video amplifier very difficult because the power loss in the amplifier is a function of the value of the output load resistor and the output load resistor is usually made large to produce a greater output drive voltage. If the video amplifier is to process high frequency signals, a large output load resistor is not desired because the wide bandwidth necessitates low circuit RC time constants. Since, at high frequencies, the stray capacitances in the circuit become considerable, a large load resistor seriously degrades the amplifier bandwidth. With pulse input signals, the conflicting requirements of wide bandwidth, high gain and low power loss present a difficult design problem.

The present invention utilizes cascode amplifiers with large load resistors for developing the high output video drive voltages with RC bypass circuits for providing very short time constants during positive and negative going signal excursions.

OBJECTS OF THE INVENTION

A principal object of the invention is to provide a novel video amplifier.

Another object of the invention is to provide a wide band video amplifier having high gain and low internal loss.

Another object of the invention is to provide a wide band, low power loss video amplifier having a short time constant for high frequency transients.

BRIEF DESCRIPTION OF THE DRAWING

Other objects and advantages of the invention will be apparent upon reading the following description in conjunction with the drawing in which.

DESCRIPTION OF THE PREFERRED EMBODIMENT

Figure 1:
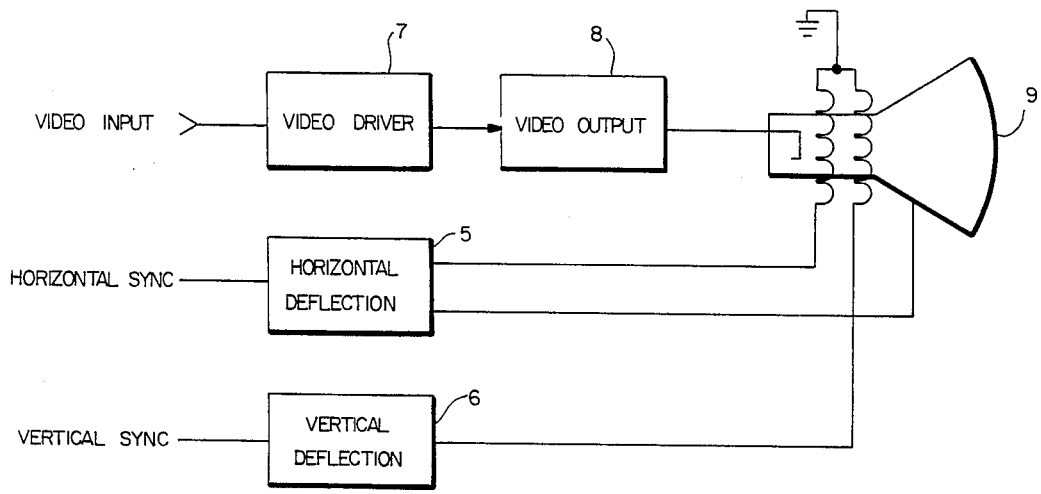
FIG. 1 represents a partial block diagram of a video monitor circuit.
Figure 2:
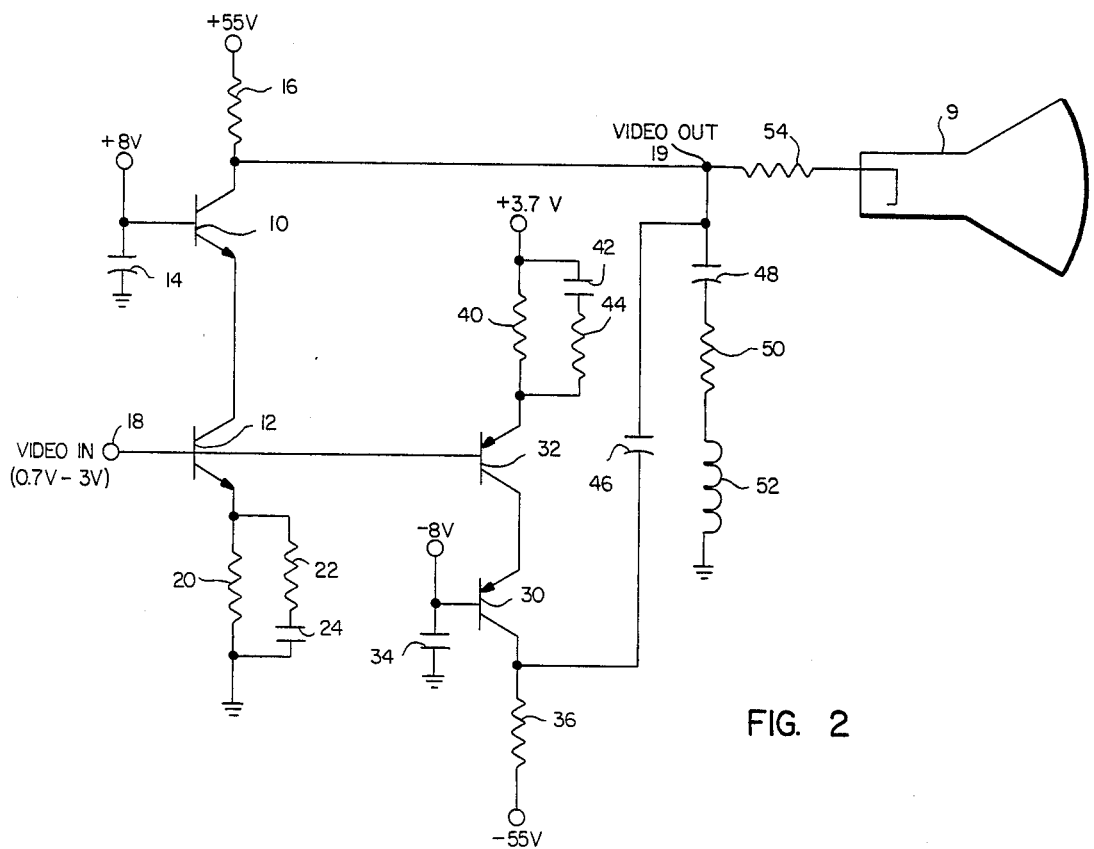
FIG. 2 represents a schematic diagram of a video amplifier constructed in accordance with the invention.

Referring to FIG. 1, horizontal and vertical sync singals are supplied to horizontal and vertical deflection circuits 5 and 6, respectively, which supply a horizontal and vertical yoke arrangement that is positioned on the neck of a conventional CRT 9. A video input signal is supplied to a video driver circuit 7 which, in turn, supplies a video amplifier or output circuit 8 for supplying the cathode of CRT 9. The video input signal may be a pulse waveform with the horizontal and vertical sync signals keyed thereto for proper display on the faceplate of CRT 9. Reference to FIG. 2 will disclose details of the operation of video output 8.

The video output includes a first cascode arrangement of NPN transistors. As is conventional, the arrangement has input and output load resistors and the emitter-collector circuits of the transistors are connected in series. An NPN transistor 10 has its emitter connected to the collector of an NPN transistor 12, and its collector connected, through an output load resistor 16, to a +55 V voltage source. The emitter of transistor 12 is connected through an input load resistor 20 to ground. In accordance with the invention, a high frequency bypass circuit, comprising a resistor 22 and a capacitor 24, is connected in parallel with load resistor 20. The base of transistor 12 is connected to a video input terminal 18 to which the video signal output of video driver 7 in FIG. 1 is supplied. The collector of transistor 10 is connected to a video output terminal 19. As indicated, the video input signal may range in voltage between 0.7 and 3 volts. The base of transistor 10 is connected to a +8 volts source, developed across a capacitor 14 that is connected to ground. Output load resistor 16 is on the order of 1,000 ohms or more and input load resistor 20 is on the order of 75 ohms. Thus the DC gain of the circuit (determined by the resistance of resistor 16 divided by the resistance of resistor 20) is quite high. In accordance with the invention, the value of resistor 22 is about 12 ohms.

Transistors 10 and 12 have similar operating characteristics except that transistor 10 is capable of withstanding much higher voltages to enable development of a relatively high video output drive voltage across load resistor 16. The collector of transistor 10 is connected through a resistor 54 to the cathode of CRT 9. Since the presence of a large output load resistor 16, in conjunction with the various stray capacitances throughout the circuit, would result in a significantly long time constant for the amplifier, a high frequency bypass is provided for resistor 16. This consists of a series circuit, including a capacitor 48, a resistor 50 and a peaking coil 52, which is coupled to output terminal 19 and which effectively parallels load resistor 16 for AC signals. It will be appreciated that in the cascode circuit shown, the AC gain is established by the combined impedance of resistors 20 and 22, and capacitor 24, and the combined impedance of resistors 16, 50, and 36, capacitors 46 and 48 and peaking coil 52.

With a positive going transition of a pulse signal input at terminal 18, transistors 12 and 10 are drive conductive with the predominant AC signal path including peaking coil 52, resistor 50, capacitor 48, the collector emitter circuits of transistors 10 and 12, resistor 22 and capacitor 24. This path includes relatively small resistors 50 and 22 which, even with the amplifier stray capacitances, provides a short RC time constant to maintain the amplifier high frequency response. After the signal transition, the capacitors 48 and 24 essentially disappear from the circuit and the amplifier gain characteristic is determined by resistors 16 and 20. Thus for positive going signal transitions, the circuit exhibits wide bandwidth and high gain. For DC, output load resistor 16 is large and the power loss in the system is low. The large load resistor makes possible a high output drive voltage for CRT 9. During negative going signal transitions, capacitors 24 and 48 are charged and require a comparatively long time to discharge.

To provide the same short RC time constant for negative going signal transitions, a cascode arrangement of PNP transistors is provided. A PNP transistor 32 is connected in series with a PNP transistor 30. The collector of transistor 30 is connected to −55 volts through an output load resistor 36, the emitter and collector of transistors 30 and 32 are connected together, and the emitter of transistor 32 is connected through a resistor 40 to +3.7 volts. Resistor 40 is bypassed by a series connection of a capacitor 42 and a small resistor 44. The collector of transistor 30 is connected through an AC coupling capacitor 46 to the collector of transistor 10. The base of transistor 30 is connected to a −8 volts source, developed across a capacitor 34 that is connected to ground and the base of transistor 32 is connected to the base of transistor 12. The connection of the emitter of transistor 32 to the +3.7 volt source enables the video input signal which ranges between 0.7 volts and 3 volts to drive the cascode arrangement of transistors 30 and 32 in its linear range. The combination of the +55 volts to one cascode, −55 volts to the other cascode and the +3.7 volt connection comprises bias means enabling the cascode arrangement of transistors 10 and 12 to be driven conductive for positive going input signal transitions excursions and the cascode arrangement of transistors 30 and 32 to be driven conductive for negative going input signal transitions. For negative going transitions of the video input signal, capacitor 42 and resistor 44 provide the AC signal path with capacitor 48, resistor 50 and peaking coil 52. Thus, for signal purposes, the output load resistors 16 and 36 share a common bypass circuit. It will be appreciated that to keep the frequency response of the amplifier flat, output load resistors 16 and 36 are equal in value, as are input load resistors 20 and 40, bypass resistors 44 and 22, and bypass capacitors 24 and 42. Reasonable care must also be taken to keep the emitter and collector circuits of the various transistors tracking each other to maintain a flat or constant frequency output response characteristic. The greater the ratio of resistors 16 and 20, the more difficult the problem of maintaining tracking between the cascode circuits. The benefits, however, are substantial. For example, for automotive use, it is contemplated that resistor 16 may be made exceptionally large, i.e., between 5,000 and 10,000 ohms to maintain high gain and low power dissipation and a reasonably high frequency response. Thus with the invention, a low power dissipation system with its intended advantages is obtained.

It will be appreciated that numerous modifications and changes in the described embodiment of the invention will be apparent to those skilled in the art without departing from its true spirit and scope. The invention is to be limited only as defined in the claims.

What is claimed is:

1. A wide band video amplifier system having an input terminal and an output terminal comprising:
    first and second cascode amplifier means, each coupled between said input terminal and said output terminal and each including load resistor means providing a short time constant for high frequency supply signals;
    means supplying a video signal to said input terminal;
    bias means coupled to said first and to said second cascode amplifier means for enabling alternate conduction of said first and said second cascode amplifier means, to produce output signals, in response to positive going and negative going excursions, respectively, of said video signal; and
    said output signals from said first and said second cascode amplifier means being combined at said output terminal.

2. The amplifier of claim 1, wherein each said cascode amplifier arrangement includes a pair of series connected transistors, and wherein said load resistor means include output and input load resistors parallelled by series connected bypass capacitors and resistors, said load resistors being of substantially higher value than said bypass resistors.

3. The amplifier of claim 2, wherein one of said cascode amplifier arrangements includes transistors of NPN configuration and the other includes transistors of PNP condiguration and wherein the capacitors and resistors in parallel with each of said input load resistors are of equal impedance value, respectively, and wherein said output load resistors are bypassed, for high frequency signals, by a common capacitor and resistor.

4. A wide band, low power loss video amplifier comprising:
    a first cascode amplifier having a first NPN transistor and a second NPN transistor, each having a load resistor, with their collector-emitter circuits connected in series;
    a second cascode amplifier having a first PNP transistor and a second PNP transistor, each having a load resistor, with their collector-emitter circuits connected in series;
    means applying a video signal to both said first NPN transistor and said first PNP transistor;
    first high frequency bypass means comprising individual RC circuits connected in parallel with the load resistor of each of said first transistors;
    second high frequency bypass means comprising a common RC circuit connected in parallel with the load resistor of each of said second transistors; and
    bias means for enabling said first cascode amplifier to be driven conductive for positive going excursions of said video signal and said second cascode amplifier to be driven conductive for negative going excursions of said video signal.

5. The amplifier of claim 4, wherein said individual RC circuits have components of equal impedance.

* * * * *